United States Patent
Kang

(10) Patent No.: US 6,283,437 B1
(45) Date of Patent: Sep. 4, 2001

(54) FOOT DEVICE

(76) Inventor: Vinsen Kang, 3F, No. 28, Alley 63, Lane 236, Nan Shan Rd., Chung Ho City, Taipei Hsien (TW)

( * ) Notice: Subject to any disclaimer, the term of this patent is extended or adjusted under 35 U.S.C. 154(b) by 0 days.

(21) Appl. No.: 09/479,063

(22) Filed: Jan. 7, 2000

(51) Int. Cl.[7] .................................................. F16F 15/00
(52) U.S. Cl. .................. 248/677; 248/188.8; 248/188.9; 248/615; 181/207; 181/208; 181/209; 384/610
(58) Field of Search .............................. 248/188.9, 188.8, 248/677, 615, 346.11, 638, 413; 181/207, 208, 209; 384/610

(56) References Cited

U.S. PATENT DOCUMENTS

| | | | |
|---|---|---|---|
| 2,612,335 | * | 9/1952 | Saltzman ............................... 248/193 |
| 4,696,583 | * | 9/1987 | Gorges ..................................... 384/49 |
| 5,138,867 | * | 8/1992 | Nish et al. ................................. 73/1 |
| 5,810,038 | * | 9/1998 | Carpinella .............................. 135/77 |
| 5,893,547 | * | 4/1999 | Cohen, Jr. ............................. 248/521 |
| 5,942,735 | * | 8/1999 | Liang .................................... 181/207 |
| 6,138,967 | * | 10/2000 | Okamoto ........................... 248/188.1 |
| 6,138,979 | * | 10/2000 | Morman ............................... 248/638 |
| 6,142,431 | * | 11/2000 | Herzog ............................. 248/188.4 |
| 6,155,530 | * | 12/2000 | Borgen ................................. 248/638 |

* cited by examiner

*Primary Examiner*—Leslie A. Braun
*Assistant Examiner*—Steven Marsh
(74) *Attorney, Agent, or Firm*—Bacon & Thomas, PLLC

(57) ABSTRACT

A foot device for supporting electronic equipment thereon comprises a sleeve having an axial through bole, and a plurality of balls one by one in line provided in the hole wherein the bottom and top balls are extended above the axial through hole. As such, in use, the electronic equipment is supported by the extended ball of the foot device, while not in contact with supporting plane. This point based contact has the effect of suspending the electronic equipment in the air, thus eliminating interference. Further, the vibration generated by the electronic equipment is not absorbed and interfered by the supporting plane, resulting in a uniform transmission of vibration to all directions without damping or interfering for achieving a maximum quality.

3 Claims, 2 Drawing Sheets

FOOT DEVICE

FIELD OF THE INVENTION

The present invention relates to support and more particularly to a foot device for stably supporting an electronic equipment on a supporting plane (table or ground).

BACKGROUND OF THE INVENTION

Conventionally, referring to FIG. 1, an electronic equipment such as parallelpiped cabinet 91 in a sound reproducing system has a speaker provided therein. The cabinet 91 is usually placed on table or ground with the bottom completely abutted thereon. As such, vibration generated by speaker will transmit progressively to the surface of table or ground. This vibration is damped by the surface gradually, totally absorbed by it, or in harmony with it. All of these contribute to the uneven transmission of vibration of speaker, resulting in a poor quality thereof.

A foot 90 is provided on bottom of cabinet 91 for improving the above deficiency in FIG. 1. The foot is a cone-shaped member made of aluminum, steel, or copper. This foot 90 aims at separating cabinet from table or ground. However, it is disadvantageous because the sharp point on top of foot 90 urges against bottom of cabinet 91 which in turn may result in foot pierced bottom of cabinet. As such, cabinet is damaged. Foot 90 may be inverted to cause its sharp point to contact with table or ground, while the planar bottom urges against cabinet. However, this still may cause scratch on table or ground. An improved cap 92 may be placed below the sharp point for protection. However, the sharp point may deform due to he weight of cabinet, or the cap is pierced, resulting in an increase of interference effect. Additionally, such foot 90 is difficult to mount and may be collapsed. Thus further improvement needs.

Another prior art is shown in FIG. 2 wherein a foot is provided on each corner of cabinet. The cap 80 has a cone-shaped recess 81 provided on the center of the side not in contact with cabinet. A vertical member 70 having two cone-shaped ends on top and bottom respectively. A base 60 corresponding to cap 80 has a hole 61 with a bore larger than the diameter of member 70 and an inverted cone-shaped end. The top end of member 70 engages with recess 81, while the bottom end inserts into a hole 61 of base 60 to engage with the bottom end thereof. It is seen that the cone-shaped ends of member 70 urge against cap 80 and base 60 respectively. Member 70 is made of tungsten steel. Thus it is durable, while the cost is relatively high. However, cap 80 and base 60 are both made of copper. Thus it is common for cap 80 and base 60 being pierced by member 70. It is further seen that there is no air opening communicated between hole 61 of base 60 and external surface of base 60. Thus once member 70 mounted between cap 80 and base 60 wherein member 70 and base 60 are very tightly engaged due to the weight of member 70, the air pressure balance between recess 81 of cap 80 and hole 61 of base 60 is not maintained. This may cause member 70 to cling to base 60, thus unabling to pull member 70 therefrom for maintenance and even worse somewhat integrally formed together. Further, member 70 may slant to one side of hole 61 when member 70 and base 60 are loosely engaged. This causes the slanted portion of member 70 to secure to base 60 for further causing base 60 to interfere with the vibration generated by cabinet. Additionally, the deformation of both top and bottom cone-shaped portions of member 70 as well as the piercing of cap 80 and base 60 all result in a compromise of quality. Additionally, such device is difficult to mount. Thus further improvement still needs.

SUMMARY OF THE INVENTION

It is an object of the present invention to provide a foot device for supporting electronic equipment thereon comprising a sleeve having an axial through hole; and a plurality of balls one by one in line provided in the axial through hole wherein the bottom and top balls are extended above the axial through hole. As such, in use, the electronic equipment is supported by the extended ball of the foot device, while not in contact with supporting plane (table or ground). This point based contact has the effect of suspending the electronic equipment in the air, thus eliminating interference. Further, the vibration generated by the electronic equipment is not absorbed and interfered by the supporting plane, resulting in a uniform transmission of vibration produced by the electronic equipment to all directions without damping or interfering for achieving a maximum quality.

The above and other objects, features and advantages of the present invention will become apparent from the following detailed description taken with the accompanying drawings.

DETAILED DESCRIPTION OF THE PREFERRED EMBODIMENTS

Figure 3:
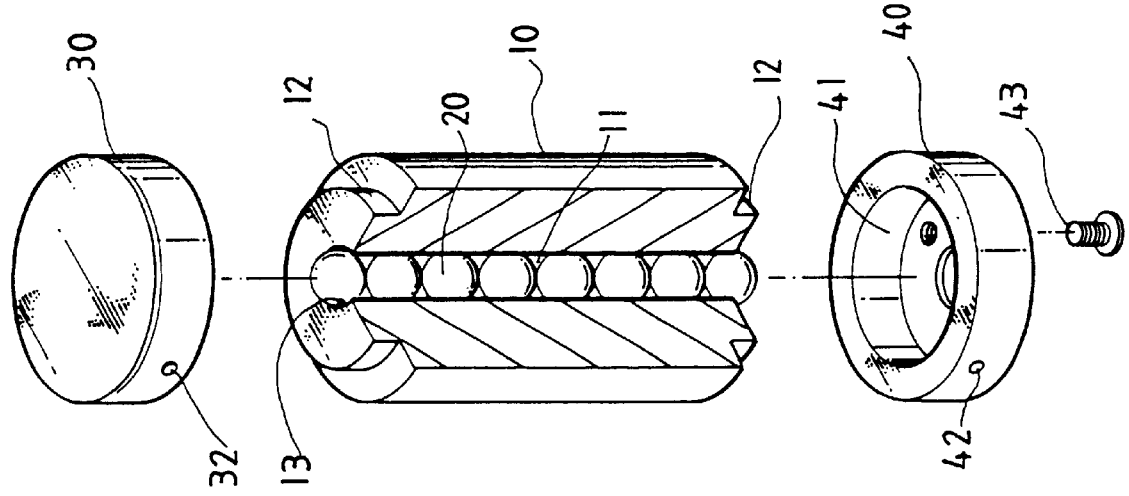
FIG. 3 is an exploded view, partially in section, of a preferred embodiment of a foot device of the invention.

Referring to FIG. 3, there is shown a foot device constructed in accordance with the invention. This foot device is used for supporting electronic equipment (e.g., loud speaker cabinet shown in FIG. 1) thereon comprising a sleeve 10 having an axial through hole 11; and a plurality of metal balls 20 one by one in line provided in the axial through hole 11. It is appreciated by those skilled in the art that alternate members can replace the use of metal balls. The diameter of ball 20 conforms to the bore of axial through hole 11. Further, the bottom and top balls 20 in the axial through hole 11 are extended above the sleeve 10.

Additionally, two circumferential flanges 12 are provided around axial through hole 11 on the top and bottom respectively. Further, a cap 30 and base 40 are provided above and under the sleeve 10 corresponding to top and bottom circumferential flanges 12 respectively. Cap 30 and base 40 are members with a round section. It is also appreciated by those skilled in the art that alternate members with different shape of section can replace the use of cap 30 and base 40. Cap 30 has a recess 31 facing the top of sleeve 10. Similarly, base 40 has a recess 41 facing the bottom of sleeve 10. The bores of recesses 31 and 41 are slightly larger than the diameter of circumferential flange 12. An air opening 32 on a periphery of cap 30 is provided for communicating outside and recess 31. Similarly, an air opening 42 on a periphery of base 40 is provided for communicating outside and recess 41. In assembling cap 30 on sleeve 10, the top of recess 31 is separated from the top of sleeve 10 by a predetermined distance because the top ball 20 is protruded above the sleeve 10.

Figure 2:
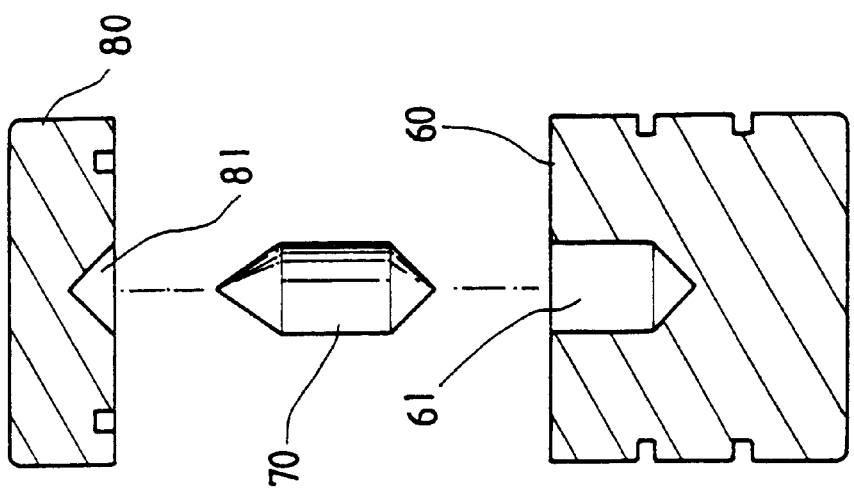
FIG. 2 is an exploded view of another prior art foot.
Figure 1:
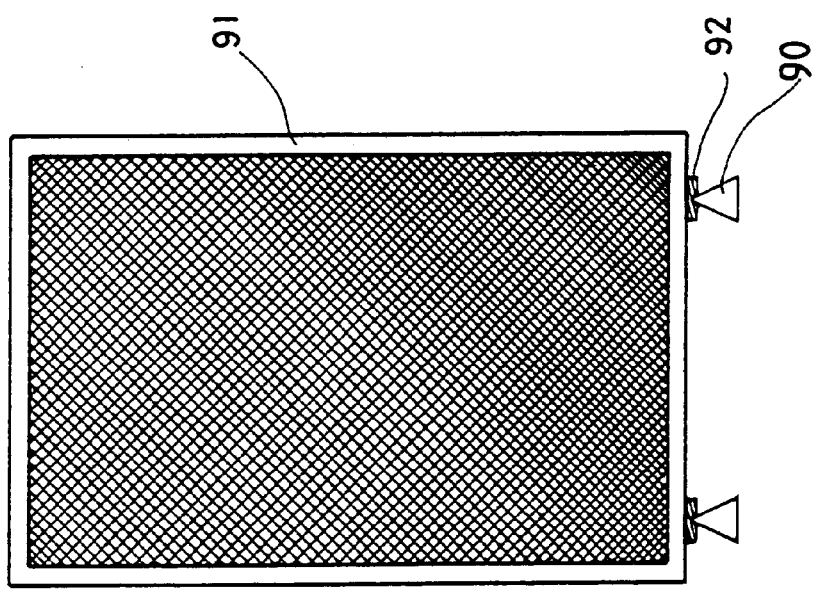
FIG. 1 is a front plan view of a prior art cabinet with foot mounted.
Figure 4:
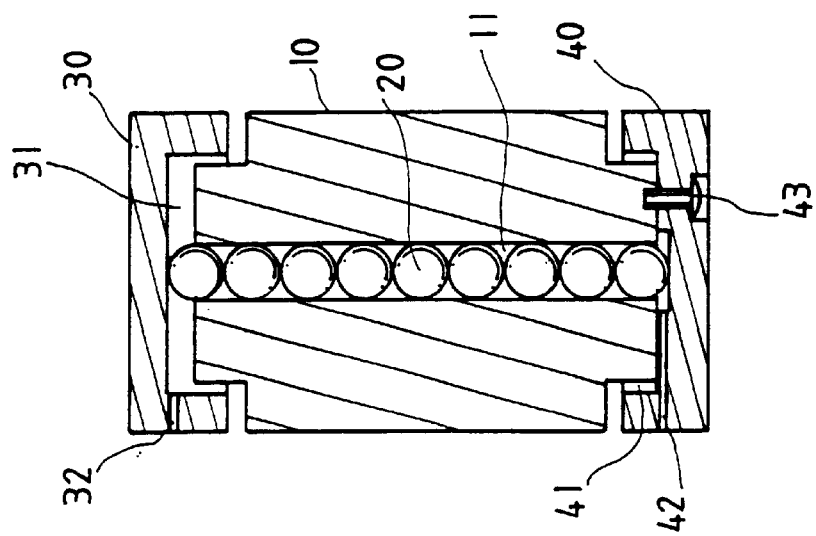
FIG. 4 is a sectional view of the foot device shown in FIG. 3.

In use, the cabinet is supported by the cap 30, while base 40 is placed on a supporting plane (table or ground). As such, a stable mounting of cabinet on the support is achieved. As stated above, cap 30 is not in contact with sleeve 10 due to the protruded topmost ball 20. In other words, cabinet is supported on supporting plane (table or ground) by balls 20 in the axial through hole 11 only. It is advantageous because cabinet is stably placed above sleeve 10 as if suspended in the air (FIGS. 1 and 4). Further, air in the recesses 31 and 41 may communicate with outside through air openings 32 and 42 for balancing the air pressures in the recesses 31 and 41. As such, balls 20 may shift smoothly within the axial through hole 11 without being interfered by unbalanced air pressure occurred in the prior art foot device. This further enhances the suspension and interference proof effects of foot device to electronic equipment. In addition, base 40 and sleeve 10 may be secured together by screw 43 for enhancing the stability of foot as well as preventing the bottommost ball 20 from escaping out of axial through hole 11 of sleeve 10. Further, a small protrusion 13 is provided in the top of axial through hole 11 of sleeve 10 for preventing the topmost ball 20 from escaping out of axial through hole 11 of sleeve 10.

Referring to FIGS. 3 and 4, in use, electronic equipment (see FIG. 1) may directly place on sleeve 10, an assembly of cap 30 and sleeve 10, an assembly of sleeve 10 and base 40, or an assembly of cap 30, sleeve 10, and base 40. As such, electronic equipment, by the support of balls 20 directly or indirectly as well as the fact that the contact of ball 20 with the other object being a point on the periphery thereof, is not in contact with sleeve 10. Note that the contact between two adjacent balls 20 in axial through hole 11 is a point. As such, electronic equipment is stably placed above sleeve 10 as if suspended in the air, thus eliminating interference. Additionally, the vibration generated by the electronic equipment is not absorbed and interfered by the supporting plane (table or ground), resulting in a uniform transmission of vibration to all directions without damping or interfering for achieving a maximum quality. It is important to note that since balls 20 are one by one in line provided in the axial through hole 11 of sleeve 10 with only a point contact between any two adjacent balls 20, the suspension and interference proof effects of foot device to electronic equipment are significantly enhanced. Furthermore, the foot device of the invention is advantageous in easy assembly, simple maintenance, and capable of carrying heavy weight of electronic equipment.

While the invention herein disclosed has been described by means of specific embodiments, numerous modifications and variations could be made thereto by those skilled in the art without departing from the scope and spirit of the invention set forth in the claims.

What is claimed is:

1. A foot device for supporting an electronic equipment on a supporting plane, the device comprising:

(a) a sleeve having an axial hole which extends therethrough to a top end and a bottom end of the sleeve;

(b) a plurality of balls disposed in the axial hole, whereby any two adjacent balls are in an engagement with each other through a contact point, a topmost ball extending beyond the top end of the axial hole and a bottommost ball extending beyond the bottom end of the axial hole;

(c) a cap disposed above the top end of the axial hole and in contact with the topmost ball for engagement by the electronic equipment, and a base disposed under the bottom end of the axial hole and in contact with the bottommost ball for engagement with the supporting plane;

(d) each of the cap and base including a recess formed therein, an air opening formed in a periphery of each of the cap and base for providing communication between the recesses and outside air to balance air pressures in the recesses; and (e) whereby the device permits supporting the electronic equipment in a suspended manner and out of contact with the supporting plane so that vibrations generated by the electronic equipment is not absorbed by the supporting plane, thereby resulting in a uniform transmission of the vibrations in all directions without damping or interference.

2. The foot device of claim 1 further including a screw securing the base and sleeve together for enhancing the stability of the device and preventing the bottommost ball from escaping out of the axial hole.

3. The device of claim 1 wherein the top end of the axial hole includes a protrusion for preventing the topmost ball from escaping out of the axial hole.

* * * * *